United States Patent [19]

Markinson et al.

[11] Patent Number: 5,008,636
[45] Date of Patent: Apr. 16, 1991

[54] APPARATUS FOR LOW SKEW SYSTEM CLOCK DISTRIBUTION AND GENERATION OF 2X FREQUENCY CLOCKS

[75] Inventors: Scott Markinson, Goffstown, N.H.; Michael Schuster, Norwood; Thomas Hogan, Worcester, both of Mass.

[73] Assignee: Apollo Computer, Inc., Chelmsford, Mass.

[21] Appl. No.: 263,714

[22] Filed: Oct. 28, 1988

[51] Int. Cl.⁵ .......................... H03L 7/06; H03L 7/07
[52] U.S. Cl. ........................................ 331/2; 331/25; 331/45
[58] Field of Search ................... 331/18, 25, 45, 60, 331/2; 328/58; 307/265; 377/47

[56] References Cited

U.S. PATENT DOCUMENTS

| | | | |
|---|---|---|---|
| 3,493,884 | 2/1970 | Kulp | 331/45 X |
| 4,021,740 | 5/1977 | Horna | 328/29 |
| 4,185,245 | 1/1980 | Fellinger et al. | 328/103 |
| 4,439,689 | 3/1984 | Chazenfus | 328/58 X |
| 4,754,166 | 6/1988 | Nagano | 307/296.1 |

FOREIGN PATENT DOCUMENTS 0103404  3/1984  European Pat. Off.
0302262  2/1989  European Pat. Off.
2120878 12/1983  United Kingdom.

OTHER PUBLICATIONS

IEEE Design & Test of Computers, vol. 5, No. 5, Oct. 1988, pp. 9–27: "Clock System Design", Wagner.

Primary Examiner—Siegfried H. Grimm
Attorney, Agent, or Firm—Weingarten, Schurgin, Gagnebin & Hayes

[57] ABSTRACT

A clock generation circuit on each circuit board of a computer system and which removes board-to-board system skew in clock signal distribution. A phase-locked loop is employed to maintain synchronization between the system reference clock signal distributed to each board and the outputs of the distribution gate array in the generation circuit on each board. A 2X frequency clock is provided by combining the clock signal with a delayed version of itself. A second order loop is employed to monitor the duty cycle of the 2X frequency clock and to adjust the duty cycle of the regular frequency clock to provide cycle-to-cycle symmetry for the 2X frequency clock.

9 Claims, 2 Drawing Sheets

FIG. 1 CLOCK DISTRIBUTION BLOCK DIAGRAM

APPARATUS FOR LOW SKEW SYSTEM CLOCK DISTRIBUTION AND GENERATION OF 2X FREQUENCY CLOCKS

FIELD OF THE INVENTION

The present invention relates to computer system clock generation apparatus and, in particular, clock generation apparatus which provides cycle-to-cycle symmetry skew compensation.

BACKGROUND OF THE INVENTION

In general, most computer system clock distribution is provided by a master oscillator signal driving a large fan out tree to create the required number of clocks to drive the entire system. However, the clock distributions for most systems require a very small time delay (skew) between the clock signal transitions at different chips on different circuit boards, as well as the ability to start and stop various groups of clocks. Multiple copies of the clock signals may be provided by a gate array on each board to "fan out" the copies of the clock. The process variations of the gate array will typically cause different arrays and therefore each circuit board to have different propagation delays, while maintaining a small variation of delay between similar paths in the same array. As a result, the clock cycle is lengthened to accommodate the expected variations in propagation delay.

The problems of clock skew errors accumulate, ultimately offsetting or limiting the improvement possible in a computer system. Techniques for clock frequency multiplication have been used which delay the master reference and XOR the delayed clock with the original. Unfortunately, the rise/fall time effects as well as previously mentioned variances of tolerances of the gate array cause the resulting signal to be nonsymmetric (i.e., each consecutive pairs of cycles not having the same period).

Moreover, computer systems frequently require clocking signals at frequency multiples of the reference or master clock signal, and the previously mentioned clock signal distribution problems are exacerbated at higher frequencies.

SUMMARY OF THE INVENTION

A frequency multiplied clock signal having low skew errors and high cycle-to-cycle symmetry is provided by the present invention which includes a phase-locked loop (PLL) circuit on each system board to align the outputs of the board gate array to a common reference clock signal sent down the system backplane. The PLL selectively moves the positions of clock input signal transitions to the gate array with respect to the reference clock signal to align the gate arrays output to that reference to remove accumulated skew errors.

In addition, the system of the present invention generates symmetric clock signals at twice the base system frequency (of 18.18 MHz) by providing a second servo loop that senses the cycle times of the generated signal by dividing the generated signal by 2 and uses the difference between the logical high time vs. the logical low time in order to adjust the symmetry of the generated signal.

BRIEF DESCRIPTION OF THE DRAWING

These and other features of the present invention will be better understood by reading the following detailed description of the drawing, wherein.

The equations used in the preferred embodiment are shown in the Appendix.

DESCRIPTION OF THE INVENTION

Figure 1:
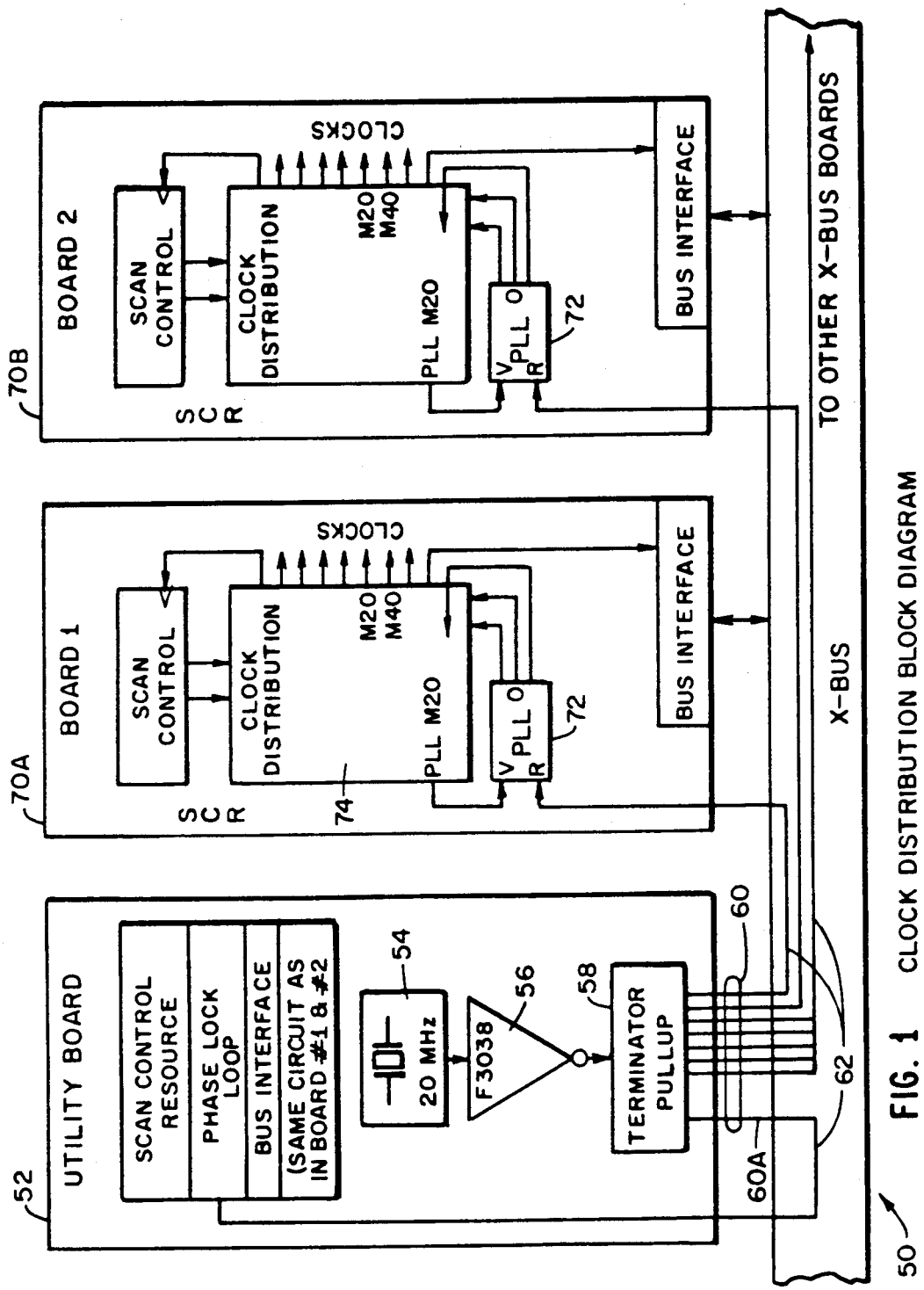
FIG. 1 is a block diagram of the clock distribution.

A system 50 having one embodiment of the present invention is shown in FIG. 1. The utility board contains a 18.18 MHz TTL oscillator 54 of high stability. This oscillator drives the input of an F3038 gate 56, comprising an open-collector, high-output current buffer, which provides a common source of all (backplane) reference clock signals. The output of the F3038 is pulled-up and source-terminated 58 with eight independent circuits (16 resistors). These eight clock leads 60 that leave the utility board are load-terminated on each bus connected board with a 10 Ω series resistor and two Schottky diodes at the input of each PLL. Each of the eight outputs goes to a bus board slot through time-matched etch runs 62. The reference clock for the utility board goes out on the backplane and back in again with the appropriate amount of etch delay preferably equal to the clock delay for other boards 70A, 70B.

The board clock distribution on each board 52, 70A, 70B includes PLL circuitry 72 and the distribution gate array (SCR) 74. The physical makeup of the PLL circuit is uniformly laid out on each bus board and in the same manner for all board types in the system. Moreover, all clock paths on each circuit board should have their printed traces matched in length to within ¼ inch.

The clock fanout logic is part of the gate array 74 that is an ICS CMOS gate array referred to as the distribution portion of the gate array. Its outputs directly drive all the clock input pins on the board. The clock distribution portion's main input signals are a 18.18 MHz clock and two delayed 18.18 MHz clocks from PLL 72. The delayed clocks are delayed by 5ns (±0.75ns) and 14.75 ns (±0.75ns). Other inputs include a power-on/reset signal and five control signals from other parts of the array. The clock portion 74 of the gate array fans out the clock to outputs whose pin-to-pin skew can be well controlled because the entire array is fabricated as a unit. Each of the outputs will drive 4 loads.

The chip also creates a 36.36 MHz signal that is in sync with the 18.18 MHz clock, discussed below.

Figure 2:
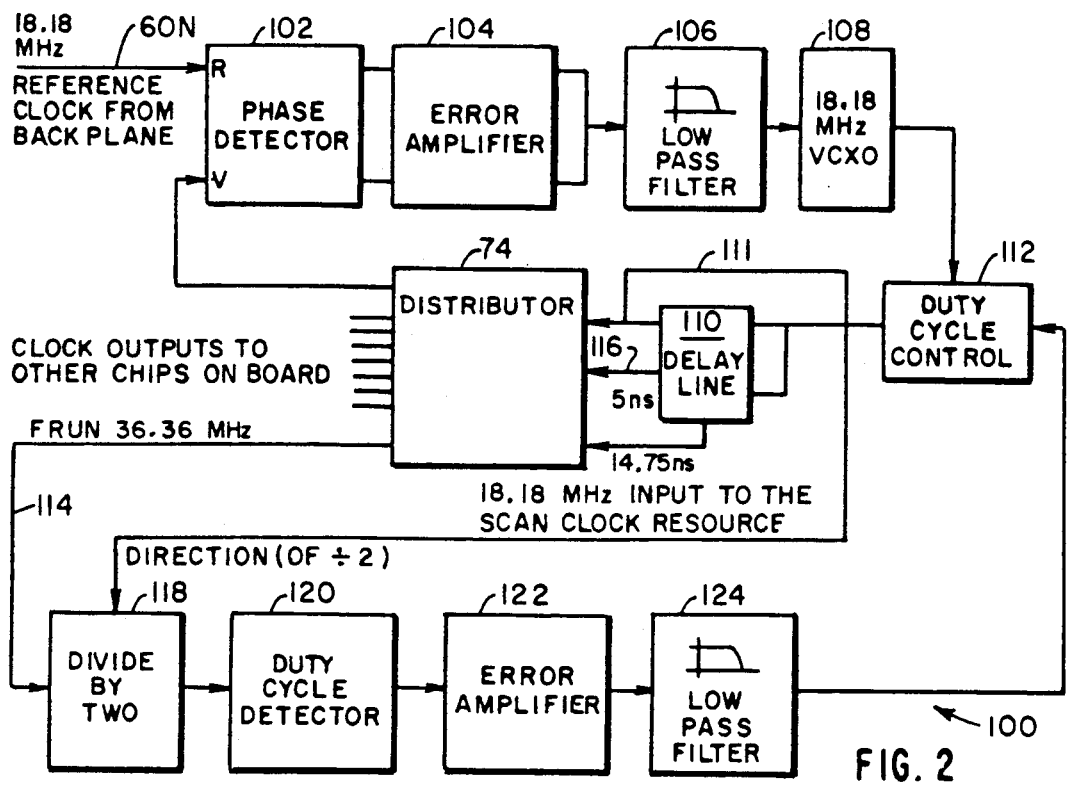
FIG. 2 is a block diagram of the phase-locked loop.

As shown in the block diagram 100 in FIG. 2, the PLL circuit includes a phase detector 102, error amplifier 104, low pass filter 106 (including an op-amp and associated resistors and capacitors), a voltage-controlled crystal oscillator 108 (VCXO), and a delay line 110. By including the distribution gate array 74, the phase-locked loop 72 compensates for skew differences between distributors 74 on different bus boards 70, effectively reducing board-to-board clock skew, and also reducing the burden on the bus interface (BIF) to compensate for large skew between two clock sources.

The VCXO 108 is a 18.18 MHz VCXO with a high stability and a control voltage range of 0.5 to 4.5 V.

The PLL circuit keeps the rising edges of the R and V inputs to the phase detector 102 aligned. The VCXO 108 creates a square wave with approximately a 60-40% duty cycle. The duty cycle control circuitry 112, discussed below, corrects the 60-40% duty cycle from the VCXO to achieve a symmetrical 36.36 MHz clock duty cycle.

The phase detector 102 detects an offset between the output of the distributor 74 and the reference clock from the backplane and corrects the offset (aligns the outputs). The phase detector (comparator) 102 comprises two ECL flip flops (10H131) and an ECL NOR gate (10H102). The Reference input to the phase comparator comes from the system backplane clock signal 60. The reference backplane signal is terminated, level shifted and clamped by input resistors and Schottky diodes to insure proper ECL logic levels and fast rise and fall times. The variable (V) input to be compared is received from the output of the distributor 74 and is essentially a delayed version of the VCXO output. The delay resulting from distributor 74 varies from approximately 5ns to 10ns. Moreover, the distributor 74 output signal is also level shifted and clamped to provide proper logic ECL levels and fast rise and fall time. The pulse output of the phase detector is amplified, is filtered by an UA714TC op amp and associated discrete components. The offset voltage amplifier 104 of the (UA714TC) is trimmed so that when the entire phase locked loop is locked the error between the reference input and the locked inputs is less than 100ps.

The third main block is the delay line 110. Although the present embodiment uses a custom active delay line with three outputs, other, separate devices may be used. The first output is considered the main output, the other two outputs are referred to this main output. The main output signal on lead 11 occurs 3.5ns±2.0ns after the input changes relative to a fixed threshold. This initially is nulled out by the main loop of the PLL. The preferred parameters are: less than 4ns rise, fall time when driving one equivalent HC load; 5ns delay tap (±0.75ns) with respect to main output 111, rising edge to rising edge and falling edge to falling edge; and 14.75ns (±0.75ns, ¼ cycle+1ns for rise time correction) with respect to main output 111, rising edge to rising edge and falling edge to falling edge.

The other outputs of the distributor 74 track very closely because circuits and paths inside the distributor 74 are very carefully matched. The PLL maintains a lock while the distributor 74 on each bus board changes propagation delay due to changes in temperature and supply voltage. This produces less board-to-board clock skew than other methods that correct for the process variation only at power-up/boot time.

Figure 3:
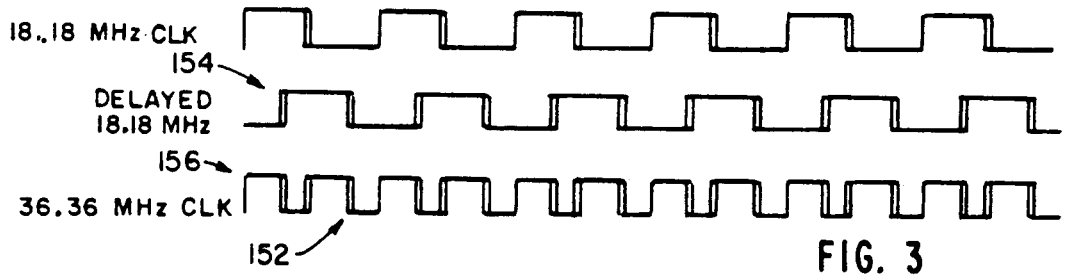
FIG. 3 is a timing diagram showing frequency multiplication errors.
Figure 4:
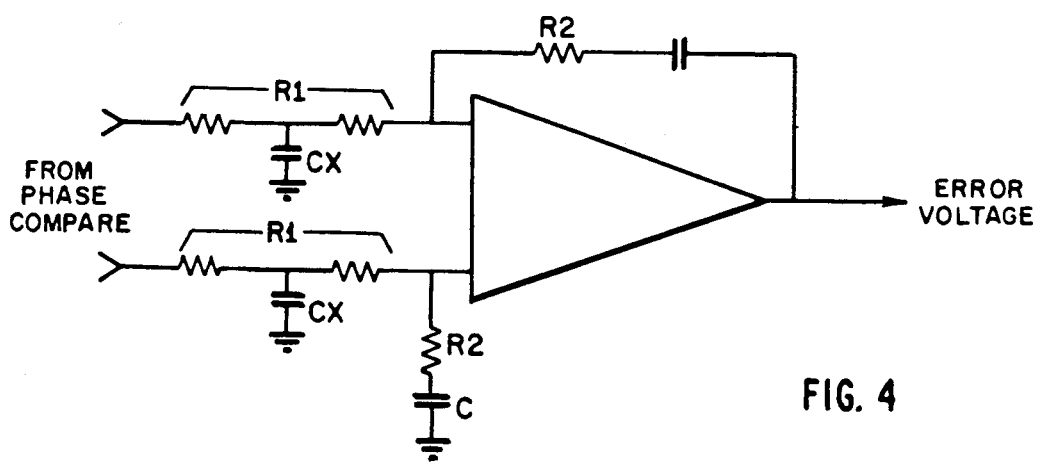
FIG. 4 is a schematic phase-locked loop error amplifier.

The multiple frequency 36.36 MHz clock signal is generated by first passing the 18.18 MHz clock through a 14.75 ±0.75sns delay line 110. Both the normal 18.18 MHz and the delayed (154) 18.18 MHz enter the distributor 74 gate array. The two signals are EXOR'ed together inside the distributor to produce a 36.36 MHz clock signal (156) on lead 114. The normal 18.18 MHz is also passed through an EXOR gate with one of its inputs tied to ground. This will balance the delay and have the resulting 18.18 MHz and 36.36 MHz clock signals in tight sync. The skew of the delay line will only appear in the falling edge 152, FIG. 3. Since most of the system is rising edge triggered, the trailing edge skew is only important to the minimum pulse width issue.

Duty cycle control is important because any variation in duty cycle of the 18.18 MHz signal translates into cycle time asymmetry (adjacent cycle-to-cycle differences in period) of the 36.36 MHz clocks generated by the CMOS gate array comprising the distribution 74. Duty cycle control of the 18.18 MHz clock is necessary to insure that the cycle time of the 36.36 MHz clock is consistent (about 27.5ns). A symmetry loop, also shown in FIG. 2, includes a divide-by-two circuit 118, a duty cycle detector 120, an error amplifier 122, a low pass filter 124 and duty cycle control circuitry 112. This loop is used to insure a consistent cycle time of the 36.36 MHz clock and is achieved by modifying the duty cycle of the 18.18 MHz clock.

To perform duty cycle adjustment, the (FRUN) 36.36 MHz clock is divided by 2 in an ECL flip-flop 118. When the high and low times are not balanced, an error signal is generated by the duty cycle detector 120, which is amplified (122) and filtered (124). The rise and fall times of the VCXO are slowed to approximately 20ns by an RC network in the duty cycle control 112. The combination of the filtered error signal and the slowed down VCXO output are combined resulting in shifting of the average DC level of the duty cycle control output signal (in response to the filter 124 output signal), causing the duty cycle of the delay line 110 output to be modified by the amount of the DC offset, as provided by variations in the slowed VCXO signal point which crosses a fixed threshold of the delay line 110. Alternately, a differential buffer or comparator having one input receiving the oscillator signal with slowed edges and the other input receiving the error voltage from filter 124 may be used. This creates a duty cycle which produces minimum cycle time variation in the 36.36 MHz clock.

A typical gate array clock tree receiving the clock signals produced by the clock distributor 74 will delay the clock signal by approximately 5ns in a fast array and 10ns in a slow array depending on manufacturing and other variables. This delay must be added in to the clock path before setup/hold (S/H) calculations can be done. This causes a problem when TTL MSI registers (not shown) are also used on the board and data is transferred between gate arrays and TTL MSI registers. With a common clock (clocking both the gate array and registers) the data is clocked into/out of the register 5-10ns before the same occurs inside of the gate array. To compensate for this effect, a delay line is added (lead 116) to the clocks that will clock the registers. The value of the delay line is determined by a combination of the clock tree delay, the time it takes for the data to enter/exit the gate array and the setup/hold time of the register. The distributor 74 provides clock outputs that are delayed by the correct amount. The array contains a fanout tree for the delayed clock signals (not shown) similar to the one used for the main 18.18 MHz clock.

The range of the delay line selection can be calculated from the setup and hold time of the transfer to/from the register. The hold time determines the minimum delay line value and the setup time determines the maximum delay line value and the ideal value was calculated as 5ns.

The actual phase locked loop compensation is calculated as Per Floyd M. Gardner, Phaselock Techniques, Second Edition 1979 by John Wiley & Sons, Inc., "Loop Fundamentals," pp. 8-11, incorporated by reference. The loop error amplifier is a differential input variation of the one shown on page 11 of that reference. The equations are shown in the Appendix.

APPENDIX

Assume $fn = 100$ Hz - because of internal pole in VCXO at 700 Hz $\omega n = 2\pi fn = 628$ rads/sec $\zeta = 1$ $$\frac{(Kosc)(Kphase)}{\omega n^2} = T1 = (R1)(C)$$

$$\frac{2}{\omega N} = T2 = (R2)(C)$$

$$Kphase = \frac{1 \text{ V}}{2\pi} = .16 \text{ V/rad.}$$

$$Kosc \text{ (Motorola K1523AA)} = \frac{(50 \text{ ppm})(20 \text{ MHz})2\pi}{1 \text{ V}} = 6.28 \times 10^3 \frac{\text{rads}}{\text{volts} - \text{sec}}$$

$$So\ T1 = \frac{(6.28 \times 10^3)(.16)}{628^2} = 2.55 \times 10^{-3}$$

$$R1 = \frac{2.55 \times 10^{-3}}{.22 \times 10^{-6}} = 11.6 \text{ K}\Omega$$

So the sum of the two resistors that make up $R1$ is 11.6 K$\Omega$ $$T2 = \frac{2}{628} = 3.18 \times 10^{-3}$$

$$R2 = \frac{3.18 \times 10^{-3}}{.22 \times 10^{-6}} = 14.5\text{K} - 14.7\text{K}$$

for MFE 2004

$$Kosc = \frac{250(20)(2\pi)}{3.7} = 8.49 \times 10^3$$

$$T1 = \frac{8.49 \times 10^3(.16)}{628^2} = 3.44 \times 10^{-3}$$

$$R1 = \frac{3.41 \times 10^{-3}}{.22 \times 10^{-6}} = 15.7 \text{ K}\Omega$$

Other frequencies, delay times and components may be selected as the values chosen (e.g., 18.18 MHz clock) relate to the preferred embodiment. Further modifications and substitutions made by one of ordinary skill in the art are within the scope of the present invention, which is not limited, except by the claims which follow.

What is claimed is:

1. Apparatus for generation of a plurality of synchronized clock signals on a computer system circuit board from a reference clock signal comprising:
   means for receiving a reference clock signal;
   means for providing a clock signal whose frequency may be varied in response to a control signal;
   means, receiving said clock signal, for providing a plurality of clock output signals having a selected phase relationship therebetween and having a delay from said reference clock signal;
   phase-locked loop means receiving said reference clock signal and a selected one of said plurality of clock output signals, for providing a control signal to said clock signal providing means, for varying the frequency of said plurality of clock output signals, to maintain a phase relationship between said plurality of clock output signals and said reference clock signal and to compensate for said delay;
   frequency multiplier means, receiving said clock signal, for providing an output signal at a frequency being a multiple of said clock signal, and comprising plural clock pulses each having a specified duty cycle relative to said clock signal; and
   duty cycle control means for controlling the duty cycle of each of said plural clock pulses.

2. The apparatus of claim 1, wherein:
   said frequency multiplier means output signal comprises two clock pulses corresponding to each clock signal; and
   said duty cycle control means provides a substantially equal duty cycle to each of said two clock pulses.

3. Apparatus for distributing clock signals in a computer system comprising:
   means for generating a reference clock signal; and
   a plurality of duplication means, receiving said reference clock signal, for generating a plurality of clock output signals having a selected phase relationship with said reference clock signal, each of said duplication means including:
   means for receiving said reference clock signal;
   means for generating a clock signal whose frequency may be varied in response to a control signal;
   means, receiving said clock signal, for providing a plurality of clock output signals having a selective phase relationship therebetween, and having a delay from said reference clock signal; and
   phase-locked loop means receiving said reference clock signal and a selected one of said plurality of clock output signals, for providing a control signal to said clock signal generating means, for varying the frequency of said clock signal to maintain a phase relationship between said plurality of clock output signals and said reference clock signal, and to compensate for said delay.

4. The apparatus of claim 3, wherein:
   said selected one of said plurality of clock output signals has a delay from said received reference clock signal different from the remainder of said plurality of clock output signals.

5. The apparatus of claim 3, including:
   frequency multiplier means, for receiving said clock signal, and for providing an output signal with a frequency being a multiple of said clock signal.

6. The apparatus of claim 5, wherein said frequency multiplier means output signal comprises a plurality of clock pulses each having a selectable duty cycle relative to said clock signal, said apparatus further including:
   duty cycle control means, for controlling the duty cycle of each of said plurality of clock pulses.

7. The apparatus of claim 6, wherein:
   said multiplier means output signal comprises first and second clock pulses for each clock signal; and
   said duty cycle control means maintains a substantially equal duty cycle between said first and second clock pulses.

8. The apparatus of claim 5, wherein said multiplier means comprises:
   means for providing at least one delay signal having a selected phase relationship to said clock signal, and having a selected delay from said clock signal; and
   means for combining said at least one delay signal and said clock signal.

9. The apparatus of claim 6, wherein said duly cycle control means comprises:
   means for determining a deviation of the duty cycle of said multiplier output signal from a predetermined duty cycle; and
   means for adjusting the duty cycle of said clock signal in response to said deviation.

* * * * *

UNITED STATES PATENT AND TRADEMARK OFFICE
CERTIFICATE OF CORRECTION

PATENT NO. : 5,008,636
DATED : April 16, 1991
INVENTOR(S) : Scott Markinson, et al It is certified that error appears in the above-indentified patent and that said Letters Patent is hereby corrected as shown below:

Column 3, line 25, "amplified, is filtered" should read --amplified, and is filtered--.

Column 4, line 65, "as Per" should read --as per--.

Column 6, line 38, "of claim 3, including" should read --of claim 3, further including--.

Signed and Sealed this

Twenty-ninth Day of June, 1993

Attest:

MICHAEL K. KIRK

Attesting Officer

Acting Commissioner of Patents and Trademarks